US010297319B2

(12) United States Patent
Giraud et al.

(10) Patent No.: US 10,297,319 B2
(45) Date of Patent: May 21, 2019

(54) MEMORY DEVICE WITH UNIPOLAR RESISTIVE MEMORY CELLS WITH PROGRAMMABLE RESISTIVE ELEMENT END CONTROL TRANSISTOR AND SET/RESET OPERATIONS OF THEREOF

(71) Applicant: Commissariat à l'Énergie Atomique et aux Énergies Alternatives, Paris (FR)

(72) Inventors: Bastien Giraud, Voreppe (FR); Alexandre Levisse, Grenoble (FR); Jean-Philippe Noel, Montbonnot Saint Martin (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/487,303

(22) Filed: Apr. 13, 2017

(65) Prior Publication Data
US 2017/0316825 A1  Nov. 2, 2017

(30) Foreign Application Priority Data

Apr. 29, 2016 (FR) .................................... 16 53902

(51) Int. Cl.
*G11C 13/00* (2006.01)
(52) U.S. Cl.
CPC ...... *G11C 13/0069* (2013.01); *G11C 13/0097* (2013.01); *G11C 13/0004* (2013.01); *G11C 13/0033* (2013.01); *G11C 2013/009* (2013.01); *G11C 2213/79* (2013.01); *G11C 2213/82* (2013.01)

(58) Field of Classification Search
CPC ............ G11C 13/0069; G11C 13/0033; G11C 13/0004; G11C 2013/009; G11C 2213/79; G11C 2213/82
See application file for complete search history.

(56) References Cited

U.S. PATENT DOCUMENTS 9,224,470 B1 * 12/2015 Chiu .................. G11C 13/0069
2010/0177555 A1   7/2010 Shimakawa et al.
2010/0265757 A1 * 10/2010 Otsuka ............... G11C 13/0009
                                                              365/148

(Continued)

OTHER PUBLICATIONS

French Search Report for Application No. FR 1653902 dated Jan. 16, 2017.

*Primary Examiner* — Mushfique Siddique
(74) *Attorney, Agent, or Firm* — Wolf, Greenfield & Sacks, P.C.

(57) ABSTRACT

A memory circuit including cells connected in rows and in columns, each cell including a programmable resistive element and a control transistor, the memory circuit further including a control circuit capable of, during a cell programming phase: applying a first voltage to a control conductive track of the column including the cell; applying a second voltage to the first control conductive track of the row including the cell; applying a third voltage capable of turning on the cell control transistor to a second row control conductive track including the cell; and applying a fourth voltage capable of turning off the control transistors to the control conductive tracks of columns which do not include the cell.

18 Claims, 5 Drawing Sheets

(56) References Cited

U.S. PATENT DOCUMENTS

| | | | |
|---|---|---|---|
| 2012/0170359 A1* | 7/2012 | Wu | G11C 11/5678 |
| | | | 365/163 |
| 2014/0126265 A1 | 5/2014 | Lee et al. | |
| 2014/0268997 A1 | 9/2014 | Nazarian et al. | |
| 2015/0009745 A1 | 1/2015 | Nguyen et al. | |
| 2015/0364193 A1 | 12/2015 | Shimakawa et al. | |
| 2016/0027509 A1* | 1/2016 | Benoist | G11C 13/004 |
| | | | 365/63 |
| 2016/0056207 A1 | 2/2016 | Nagumo et al. | |

* cited by examiner

MEMORY DEVICE WITH UNIPOLAR RESISTIVE MEMORY CELLS WITH PROGRAMMABLE RESISTIVE ELEMENT END CONTROL TRANSISTOR AND SET/RESET OPERATIONS OF THEREOF

CROSS-REFERENCE TO RELATED APPLICATION

This application claims priority to of French patent application number 16/53902, filed Apr. 29, 2016, the content of which is hereby incorporated by reference in its entirety to the maximum extent allowable by law.

BACKGROUND

The present disclosure generally relates to electronic circuits, and more specifically targets the field of programmable-resistance non-volatile memories, currently called resistive memories.

DISCUSSION OF THE RELATED ART

Resistive memories take advantage of the ability of certain materials to change electric resistivity, in reversible and non-volatile fashion, under the effect of a biasing. A resistive memory comprises a plurality of elementary storage cells, each cell comprising at least one programmable-resistance resistive storage element capable of having at least two different resistance values, for example, a first value (or low value) noted LRS, and a second value greater than value LRS (or high value), noted HRS. Each elementary cell further conventionally comprises one or a plurality of control transistors. The resistive storage element may comprise two conductive regions or electrodes, separated by a layer of a programmable-resistance material. The application of a properly-selected voltage between the two electrodes for a determined time period enables to modify the resistance of the programmable-resistance layer. Data can thus be recorded in the cells based on resistance values. The fact of switching the resistance of the resistive element of the cell from high value HRS to low value LRS is called a memory cell setting operation. The fact of switching the resistance of the resistive element of the cell from low value LRS to high value HRS is called a memory cell resetting operation.

Two categories of resistive memories, conventionally called bipolar resistive memories and unipolar resistive memories, can be distinguished. In bipolar resistive memories, the voltage applied across a resistive element of a cell during a set operation and the voltage applied across this element during a reset operation have opposite polarities. In unipolar resistive memories, the voltage applied across a resistive element of a cell during a set operation and the voltage applied across this element during a reset operation are of same polarity, the resistivity state (HRS or LRS) to which the resistive element is programmed essentially depending on the shape of the applied voltage pulse. Unipolar resistive memories are here more particularly considered. As an example, unipolar resistive memories particularly comprise phase change resistive memories, or PCMs, where the resistive storage element comprises a layer of a phase-change material, for example, a chalcogenide glass, having its crystalline or amorphous state respectively corresponding to low resistance value LRS and to high resistance value HRS, modified by heating of said layer under the effect of a voltage pulse applied across the element. The voltage pulse applied during a set operation and the voltage pulse applied during a reset operation have the same polarity, the crystalline or amorphous state to which the resistive element is programmed mainly depending on the slope of the falling edge of the pulse.

Existing resistive memories have various disadvantages, particularly problems of reliability along time, due to the fact that the voltage levels applied to program the elementary cells may be relatively high. It would be desirable to have a resistive memory overcoming all or part of these disadvantages.

SUMMARY

Thus, an embodiment provides a memory circuit comprising a plurality of elementary cells arranged in rows and in columns, each cell comprising: a programmable resistive element having a first end coupled to a first node of the cell; and a control transistor having a first conduction node coupled to a second end of the resistive element, a second conduction node coupled to a second node of the cell, and a control node coupled to a third node of the cell, wherein, in each row, the cells in the row have their first nodes coupled to a same first row control conductive track and have their third nodes coupled to a same second row control conductive track, and, in each column, the cells have their second nodes coupled to a same column control conductive track, the memory circuit further comprising a control circuit capable of, during a cell programming phase: applying a first voltage to the control conductive track of the column comprising the cell to be programmed; applying a second voltage to the first control conductive track of the row comprising the cell to be programmed; applying a third voltage to the second control conductive track of the row comprising the cell to be programmed, the third voltage being capable of turning on the control transistor of the cell to be programmed; and applying a fourth voltage to the conductive tracks controlling columns which do not comprise the cell to be programmed, the fourth voltage being capable of turning off the control transistors in the cells comprised both in said columns and in the row comprising the cell to be programmed.

According to an embodiment, in each cell, the control transistor is an N-channel MOS transistor.

According to an embodiment, the second and third voltages are greater than the first voltage, and the fourth voltage is greater than the third voltage minus the threshold voltage of the control transistor.

According to an embodiment, the fourth voltage is in the range from the third voltage minus the threshold voltage of the control transistor to the second voltage.

According to an embodiment, in each cell, the control transistor is a P-channel MOS transistor.

According to an embodiment, the second and third voltages are smaller than the first voltage, and the fourth voltage is smaller than the third voltage plus the threshold voltage of the control transistor.

According to an embodiment, the fourth voltage is in the range from the second voltage to the third voltage plus the threshold voltage of the control transistor.

According to an embodiment, the control circuit is further capable of, during a phase of programming the cell, applying a fifth voltage to the first conductive tracks controlling rows which do not comprise the cell to be programmed, the difference between the first and fifth voltages being, in absolute value, smaller than or equal to a nominal maximum voltage specified for the cell control transistors.

According to an embodiment, the fourth and fifth voltages are substantially equal.

According to an embodiment, the third and fourth voltages are substantially equal.

The foregoing and other features and advantages will be discussed in detail in the following non-limiting description of specific embodiments in connection with the accompanying drawings.

DETAILED DESCRIPTION

Figure 1:
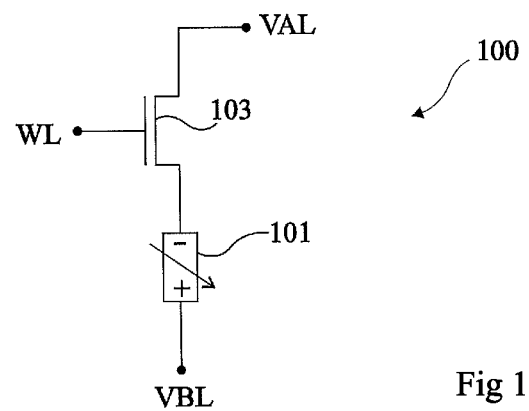
FIG. 1 is an electric diagram of an example of an elementary cell of a resistive memory.

The same elements have been designated with the same reference numerals in the different drawings and, further, the various drawings are not to scale. For clarity, only those elements which are useful to the understanding of the described embodiments have been shown and are detailed. In particular, the control circuits arranged at the periphery of a resistive memory to apply appropriate control signals to the elementary cells of the memory have not been detailed, the forming of such control circuits being within the abilities of those skilled in the art based on the functional indications described in the present disclosure. Unless otherwise specified, expressions "approximately", "substantially", and "in the order of" mean to within 10%, preferably to within 5%. In the present disclosure, term "connected" is used to designate a direct electric connection, with no intermediate electronic component, for example, by means of one or a plurality of conductive tracks or conductive wires, and term "coupled" or term "linked" is used to designate either an electric connection which may be direct (then meaning "connected") or indirect (that is, via one or a plurality of intermediate components).

FIG. 1 is an electric diagram illustrating an example of an elementary cell 100 of a resistive memory. In this example, cell 100 comprises a single resistive storage element 101, for example, of PCM type, and a single control transistor 103. Resistive element 101 is compatible with a unipolar operation, that is, it is capable of being set or reset by application of voltages of same polarity between its electrodes. It should be noted that the programmable resistive elements adapted to a unipolar operating mode generally have a preferred direction of application of the programming voltage. Thus, the electrodes of a programmable resistive element of a unipolar memory are most often differentiated, one of the electrodes, called negative electrode or cathode, being intended to receive the low potential of the voltage for programming the element, and the other electrode, called positive electrode or anode, being intended to receive the high potential of the programming voltage. In the shown example, the negative electrode of resistive element 101 is designated with a − sign, and the positive electrode of resistive element 101 is designated with a + sign. The positive electrode (+) of element 101 is coupled to a first control node VBL of the cell, and the negative electrode (−) of element 101 is coupled to a first conduction node of transistor 103, the second conduction node of transistor 103 being coupled to a second control node VAL of the cell. Cell 100 further comprises a third control node WL coupled to the gate of transistor 103. In this example, transistor 103 is an N-channel MOS transistor.

Figure 2:
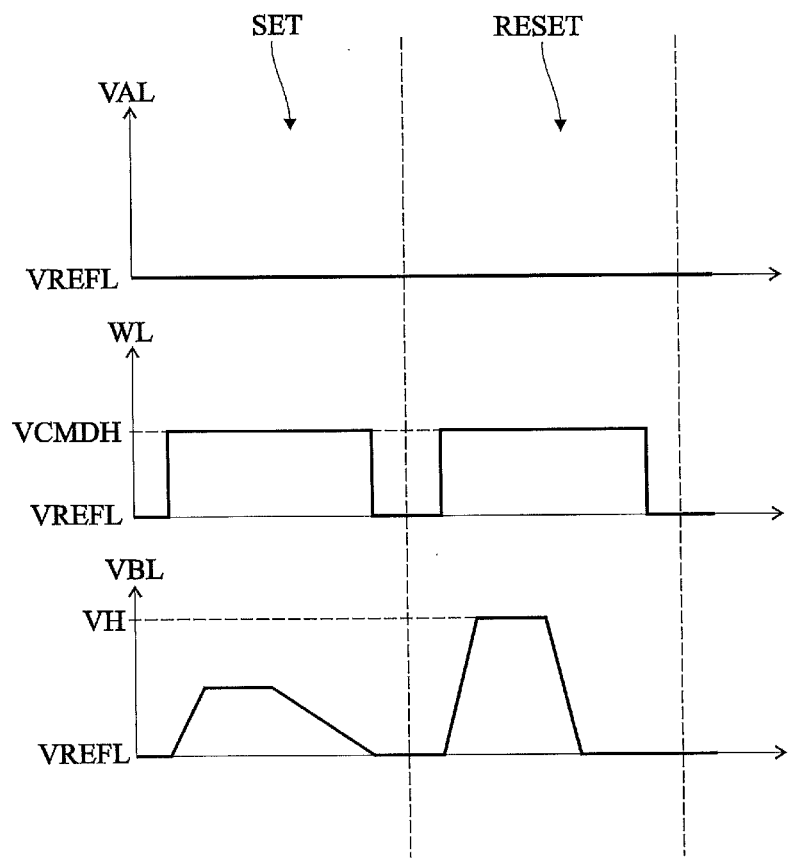
FIG. 2 is a timing diagram illustrating an example of a method for controlling the cell of FIG. 1.

FIG. 2 is a timing diagram illustrating an example of a method of controlling the cell of FIG. 1. More specifically, FIG. 2 shows the time variation of the voltages applied to control nodes VAL, WL, and VBL of cell 100 during cell set and reset phases.

In a phase of setting (SET) cell 100, node VAL, corresponding to the source of transistor 103, is set to a low reference node or ground VREFL, for example, a voltage in the order of 0 V, and a programming voltage pulse of high level as compared with reference voltage VREFL is applied to node VBL (initially at reference voltage VREFL). During the entire set phase, control transistor 103 of the cell is kept on by application of a high voltage level VCMDH (referenced to ground) to node WL.

During a phase (RESET) of resetting cell 100, similar voltages are applied to nodes VAL, VBL, and WL of cell 100, the main difference being the shape of the high-level programming voltage pulse applied to node VBL. More particularly, in the example of FIG. 2, the slope of the falling edge of the voltage pulse applied to node VBL during reset phases is greater than the slope of the falling edge of the voltage pulse applied to this same node VBL during set phases. Further, in this example, the maximum value of the voltage pulse applied to node VBL during reset phases is greater than the maximum value of the voltage pulse applied to this same node VBL during set phases. VH here designates the maximum voltage level (referenced to ground) applied to node VBL during cell set and reset phases. In practice, level VCMDH may be lower than level VH. As an illustration, levels VH and VCMDH may be respectively in the order of 2.5 V and in the order of 1.8 V (in the case where the reference voltage is at 0 V, it being understood that the described operation may be obtained by shifting all voltage levels upwards or downwards).

Figure 3:
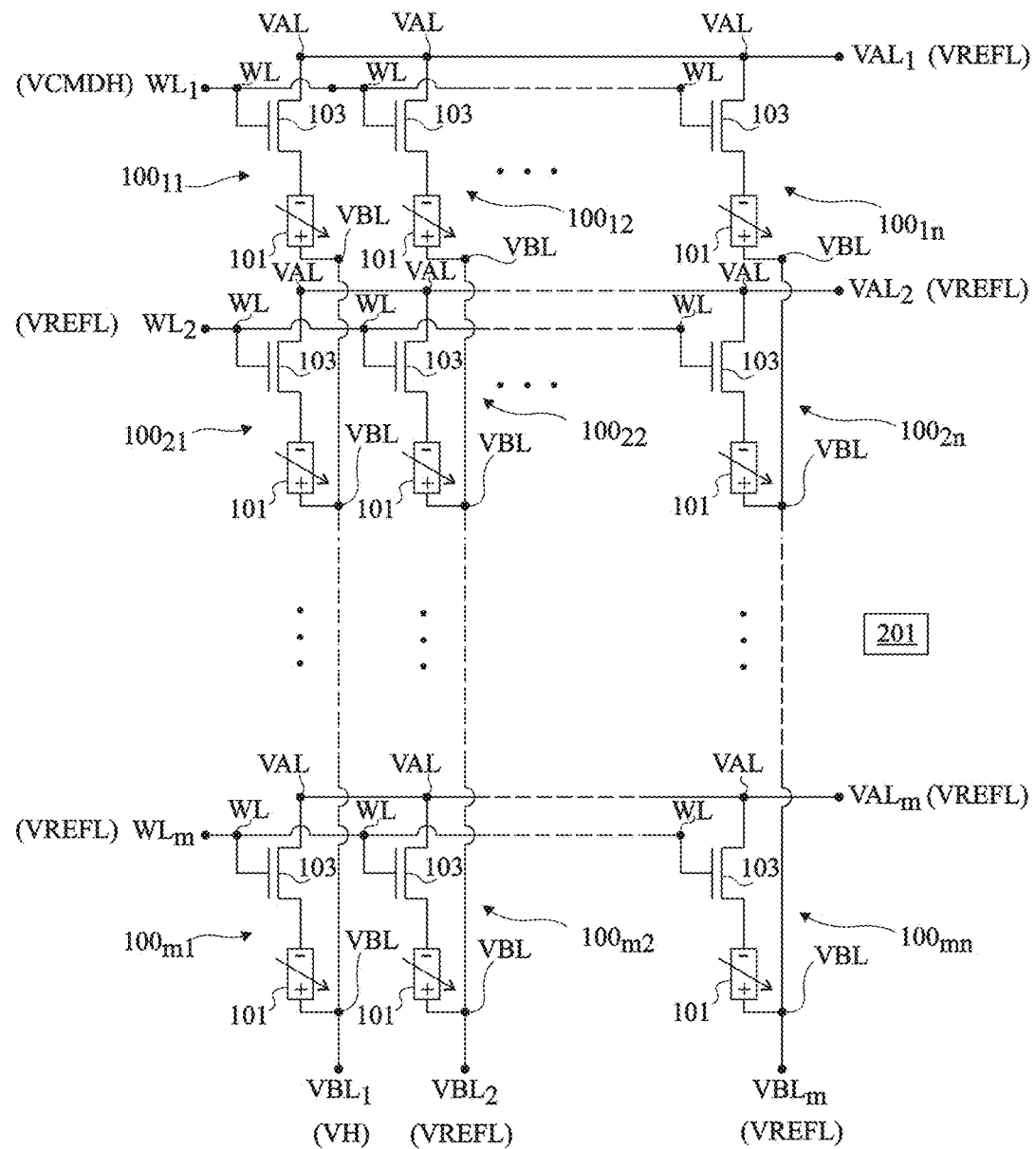
FIG. 3 is an electric diagram of a resistive memory comprising a plurality of elementary cells of the type described in relation with FIG. 1.

FIG. 3 is an electric diagram of a resistive memory comprising a plurality of elementary cells $100_{ij}$ of the type described in relation with FIG. 1. Cells $100_{ij}$ are arranged in an array of m rows and n columns, m and n being integers greater than 1, i and j being indexes respectively designating the rank of the row and the rank of the column to which each cell belongs, i being an integer in the range from 1 to m and j being an integer in the range from 1 to n. Cells $100_{ij}$ are for example identical or similar. In each row of rank i of the array, the n cells $100_{ij}$ of the row have their control nodes VAL connected to a same first row control conductive track $VAL_i$, and have their control nodes WL connected to a same second row control conductive track $WL_i$. In each column of rank j of the array, the m cells $100_{ij}$ of the column have their control nodes VBL connected to a same column control conductive track $VBL_j$. The memory of FIG. 3 further comprises a control circuit 201 capable of controlling the voltages applied to control tracks $VAL_i$, $WL_i$ and $VBL_j$ of the memory to implement operations of setting or of resetting elementary cells of the memory according to a unipolar operating mode of the type described in relation with FIG. 2.

The operation of the memory of FIG. 3, implemented by control circuit 201, is the following. During a phase of setting or resetting a cell $100_{ij}$ of the array (cell $100_{11}$ in the shown example), conductive track $VAL_i$ of the row containing the cell is set to low reference voltage VREFL, and a high-level programming voltage pulse, for example, of level VH, is applied to conductive track $VBL_j$ (initially at reference voltage VREFL) of the column containing the cell. During this entire set or reset phase, control transistor 103 of the cell is kept on by application of a high voltage level VCMDH to the conductive track $WL_i$ of the row containing the cell. To avoid an unwanted switching of a resistive storage element in another cell of the array, conductive tracks $VAL_i$ and $WL_i$ of the other rows of the array and conductive tracks $VBL_j$ of the other columns of the array may be maintained at reference voltage VREFL during the entire set or reset phase.

A problem raised by this operating mode is the relatively high stress undergone by control transistors 103 of the unprogrammed elementary cells of the row and of the column comprising the programmed cell. Indeed, during a phase of setting or of resetting a cell $100_{ij}$, each of the cells of the column of rank j, except for cell $100_{ij}$, has its control transistor 103 controlled to the off state, and is applied a voltage of level VH between its nodes VBL and VAL. In the case of MOS transistors, this results in an accelerated aging and in a risk of breakdown of the spacers of the non-activated transistors 103 of the column. Further, in each of the cells of the row of rank i except for cell $100_{ij}$, the cell control transistor 103 is applied a voltage of level VCMDH on its gate, and a substantially zero voltage between its conduction nodes. In the case of MOS transistors, this results in an accelerated aging and in a risk of breakdown of the gate oxide of the non-activated transistors 103 of the row. To avoid a premature degradation of transistors 103, the latter may be sized to resist the above-mentioned stress, but this has a cost in terms of semiconductor surface area occupied by the transistors, and is a limitation to the increase of the memory density.

Another problem posed by the above-described operating mode is that it results in the flowing of relatively high parasitic leakage currents in the memory. In particular, during a phase of setting or resetting a cell $100_{ij}$, a relatively high programming current flows from conductive track $VAL_i$ to conductive track $VBL_j$, through cell $100_{ij}$. Under the effect of this current, and due to the intrinsic resistivity of conductive track $VAL_i$, a potential gradient appears on conductive track $VAL_i$. Thus, in each of the cells of the row of rank i, the voltage on node VAL of the cell may take a value slightly greater than the reference voltage applied at the end of conductive track $VAL_i$. Given that a turn-on control voltage of level VCMDH is applied to control nodes WL of each of the cells in the row, relatively high parasitic currents may flow through transistors 103 of the non-activated cells of the row. Further, in each of the non-activated cells of the column comprising cell $100_{ij}$, leakage currents may appear due to the relatively high source-drain voltage applied to control transistors 103.

Figure 4A:
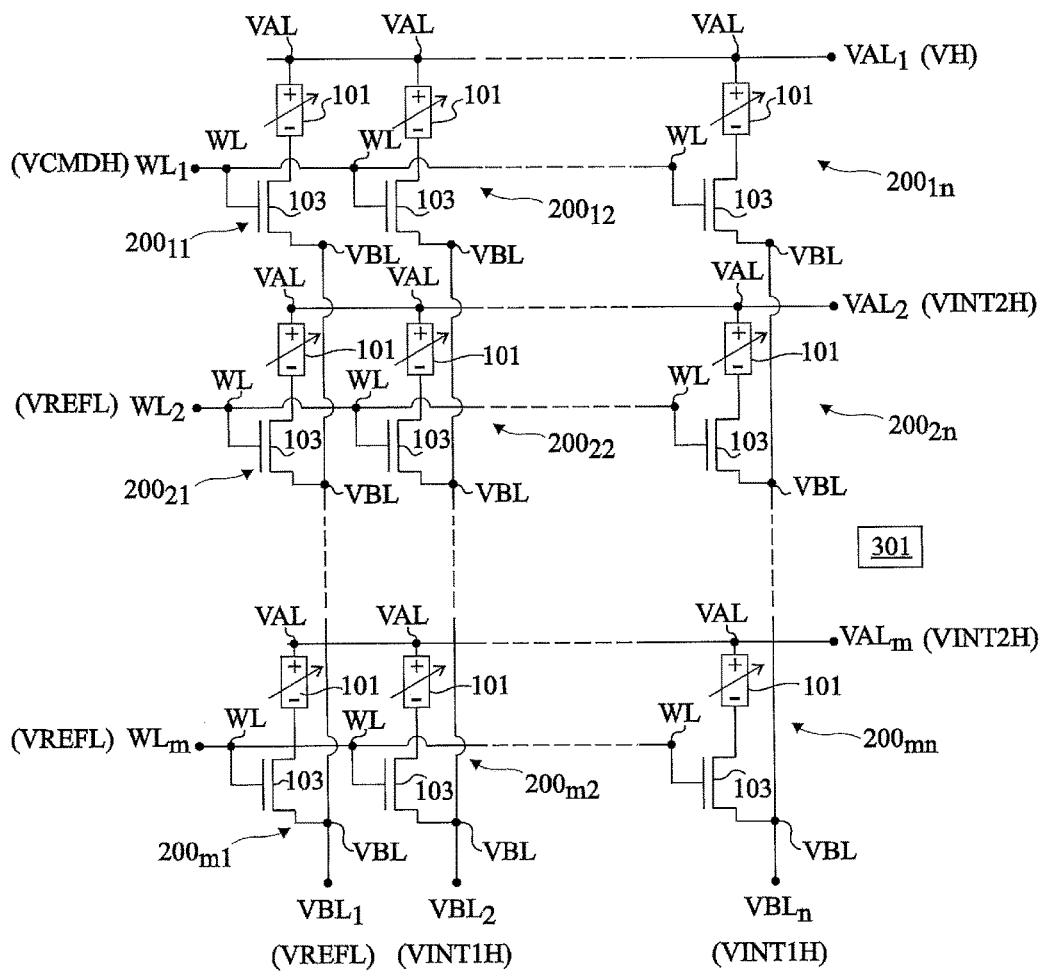
FIG. 4A is an electric diagram of another embodiment of a resistive memory.

FIG. 4A is an electric diagram of an embodiment of a resistive memory. The memory of FIG. 4A comprises a plurality of elementary cell $200_{ij}$, for example, identical or similar. Elementary cells $200_{ij}$ comprise the same elements as elementary cells $100_{ij}$ of the memory of FIG. 3, arranged differently. In particular, in each elementary cell $200_{ij}$ of the memory of FIG. 4A, the series association of resistive element 101 and of transistor 103 is reversed between control nodes VAL and VBL of the cell with respect to the configuration described in relation with FIGS. 1 and 3. Thus, in the memory of FIG. 4A, in each elementary cell $200_{ij}$, the positive electrode (+) of element 101 is coupled to control node VAL of the cell, and the negative electrode (−) of element 101 is coupled to a first conduction node of transistor 103, the second conduction node of transistor 103 being coupled to control node VBL of the cell. In the same way as in the configuration of FIGS. 1 and 3, third control node WL of the cell is connected to the gate of transistor 103.

Elementary cells $200_{ij}$ of the memory of FIG. 4A are arranged in an array of m rows and n columns, similarly or identically to what has been described in relation with FIG. 3. In particular, in each row of rank i of the array, the n cells $200_{ij}$ of the row have their control nodes VAL connected to a same first row control conductive track $VAL_i$ and have their control nodes WL connected to a same second row control conductive track $WL_i$, and, in each column of rank j of the array, the m cells $200_{ij}$ of the column have their control nodes VBL connected to a same column control conductive track $VBL_j$. The memory of FIG. 4A further comprises a control circuit 301 capable of controlling the voltages applied to control tracks $VAL_i$, $WL_i$ and $VBL_j$ of the memory to implement operations of setting or of resetting cells of the memory according to a unipolar operating mode.

The operation of the memory of FIG. 4A, implemented by control circuit 301, is the following. During a phase of setting or resetting a cell $200_{ij}$ of the array (cell $200_{11}$ in the shown example), the conductive track VBL of the column containing the cell is set to reference voltage VREFL, and a high-level programming voltage pulse, for example, of level VH, is applied to conductive track $VAL_i$ (initially at reference voltage VREFL) of the row containing the cell. During this entire set or reset phase, control transistor 103 of the cell is kept on by application of a high voltage level VCMDH to the conductive track $WL_i$ of the row containing the cell.

Further, all along the set or reset phase, to avoid an unwanted switching of a resistive storage element in another cell of the array, the conductive tracks VBL of the other columns of the array may be maintained at a high-level voltage (that is, greater than VREFL) VINT1H, the conductive tracks $VAL_i$ of the other rows of the array may be maintained at a high-level voltage (that is, greater than VREFL) VINT2H, and the conductive tracks $WL_i$ of the other rows of the array may be maintained at reference voltage VREFL.

Figures 4B, 5B:
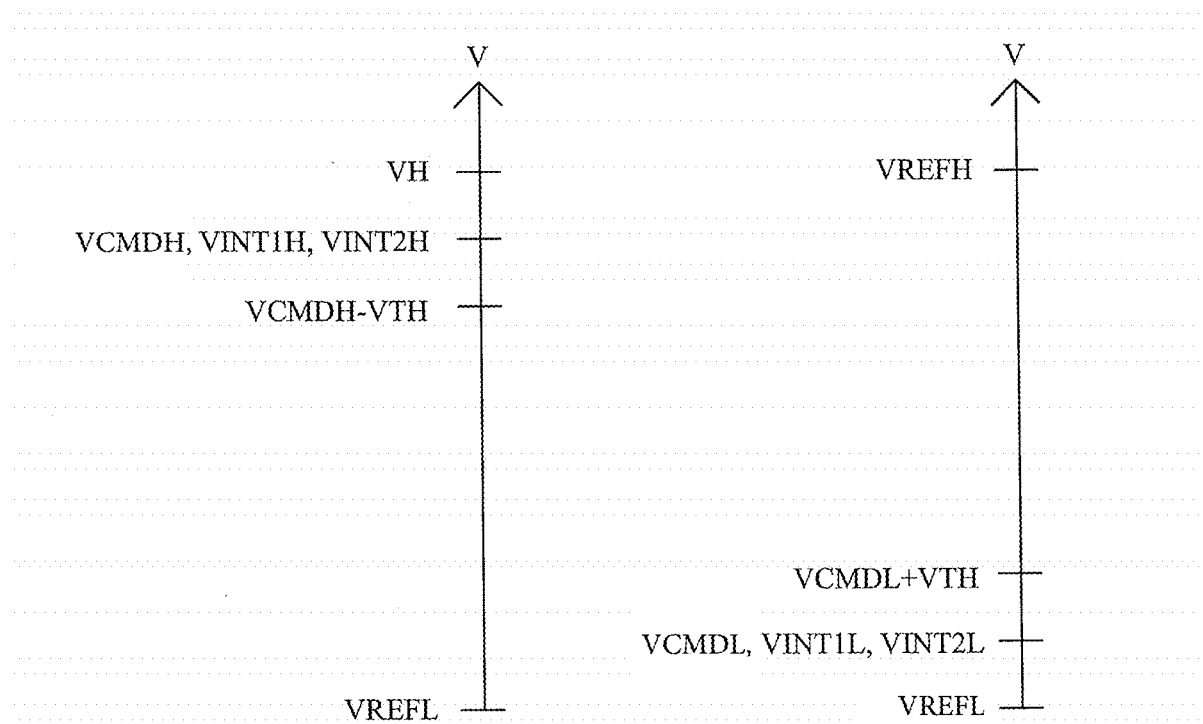
FIG. 4B shows relative voltages applied to an embodiment of a resistive memory.
FIG. 5B shows relative voltages applied to an embodiment of a resistive memory.

FIG. 4B shows relative voltages applied to an embodiment of a resistive memory. Level VINT1H may be selected to ensure that the transistors 103 of the non-activated cells of the row comprising the programmed cell $200_{ij}$ are off, while limiting to an acceptable level the source-drain voltage seen by these transistors, for example, to a level lower than or equal to the nominal drain-source voltage specified for these transistors. In particular, level VINT1H is selected to be greater than VCMDH-VTH, where VTH is the threshold voltage of transistors 103, so that the gate-source voltage of the transistors 103 of the non-activated cells in the row is smaller than threshold voltage VTH of transistors 103. Level VINT1H is for example substantially equal to level VCMDH. As a variation, level VINT1H is in the range from VCMDH-VTH to VH.

Level VINT2H may be selected to limit to an acceptable level the drain-source voltage of transistors 103 of the other rows in the array, for example, to a level smaller than or equal to the nominal drain source voltage specified for these transistors. As an example, level VINT2H is lower than level VH. Level VINT2H is for example substantially equal to level VINT1H, for example, in the order of VCMDH.

As compared with the configuration of FIG. 3, an advantage of the embodiment of FIG. 4A is that the transistors 103 of the unprogrammed cells of the row comprising the programmed cell are submitted to no significant stress, either at the level of their gate oxide (transistors 103 off), or at the level of their spacers (drain-source voltage smaller than VH). Further, in the embodiment of FIG. 4A, the parasitic currents in transistors 103 of the unprogrammed cells of the row comprising the programmed cell can be made nonexistent or negligible.

Another advantage of the embodiment of FIG. 4A is that the transistors 103 of the unprogrammed cells of the column comprising the programmed cell see a decreased drain-source voltage as compared with the configuration of FIG. 3, whereby the stress and the leakage currents are decreased.

Thus, in the embodiment of FIG. 4A, only the programmed cell is likely to be submitted to significant stress. In particular, only the programmed cell is likely to see between its terminals a voltage of level VH. This results, for identical sizings of transistors 103, in an increased lifetime and reliability of the memory as compared with the configuration of FIG. 3. Further, the decrease of parasitic leakage currents enables to limit the electric power consumption as compared with the configuration of FIG. 3.

Figure 5A:
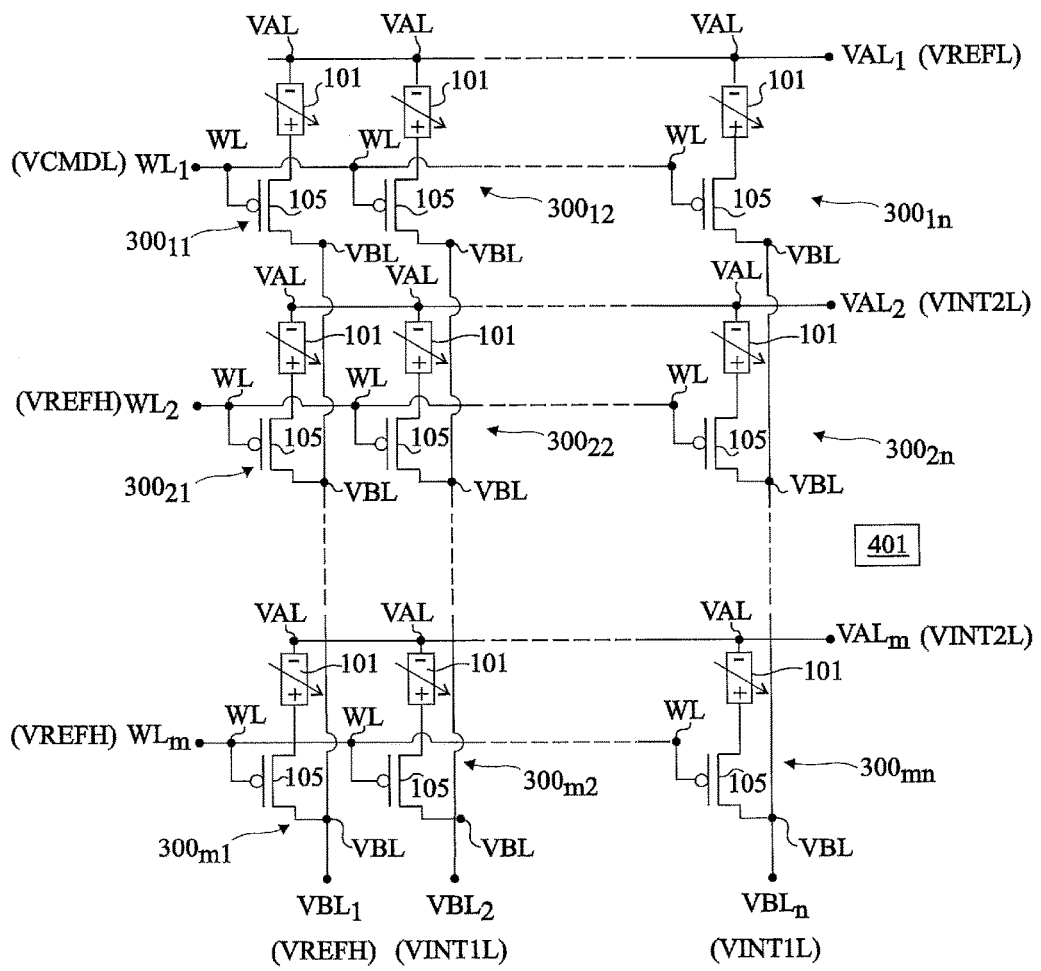
FIG. 5A is an electric diagram of another embodiment of a resistive memory.

FIG. 5A is an electric diagram of another embodiment of a resistive memory. The embodiment of FIG. 5A differs from the embodiment of FIG. 4A in that, in the embodiment of FIG. 5A, the control transistors of the elementary cells of the memory are P-channel MOS transistors.

The memory of FIG. 5A comprises a plurality of elementary cell $300_{ij}$, for example, identical or similar. In this example, each elementary cell $300_{ij}$ comprises a single resistive storage element 101 of the type described in relation with FIGS. 1, 3, and 4A, and a single control transistor 105. In this example, transistor 105 is a P-channel MOS transistor. The negative electrode (−) of element 101 is coupled to a first control node VAL of the cell, and the positive electrode (+) of element 101 is connected to a first conduction node of transistor 105, the second conduction node of transistor 105 being connected to a second control node VBL of the cell. Each elementary cell $300_{ij}$ further comprises a third control node WL connected to the gate of transistor 105.

Elementary cells $300_{ij}$ of the memory of FIG. 5A are arranged in an array of m rows and n columns, similarly or identically to what has been described in relation with FIGS. 3 and 4A. In particular, in each row of rank i of the array, the n cells $300_{ij}$ of the row have their control nodes VAL connected to a same first row control conductive track $VAL_i$ and have their control nodes WL connected to a same second row control conductive track $WL_i$, and, in each column of rank j of the array, the m cells $300_{ij}$ of the column have their control nodes VBL connected to a same column control conductive track $VBL_j$. The memory of FIG. 5A further comprises a control circuit 401 capable of controlling the voltages applied to control tracks $VAL_i$, $WL_i$ and $VBL_j$ of the memory to implement operations of setting or resetting cells of the memory according to a unipolar operating mode.

The operation of the memory of FIG. 5A, implemented by control circuit 401, is the following. During a phase of setting or resetting of a cell $300_{ij}$ of the array (cell $300_{11}$ in the shown example), conductive track VBL of the column containing the cell is set to a high reference voltage (that is, greater than low reference voltage VREFL) VREFH, for example, of level VH, and a low-level programming voltage pulse, that is, smaller than high reference voltage VREFH, is applied to conductive track $VAL_i$ (initially at high reference voltage VREFH) of the row containing the cell. The level and the shape of the low-level programming voltage pulse applied to track $VAL_i$ are selected according to the state to which the cell is desired to be programmed. As an example, by analogy with the embodiment of FIG. 2, if the level of high reference voltage VREFH is equal to VH, the level, that is, the minimum value, of the low-level programming voltage pulse applied to track $VAL_i$, may be in the order of low reference voltage VREFL in the case of a reset operation, or greater than low reference voltage VREFL in the case of a set operation. During the entire set or reset phase, control transistor 105 of the cell is kept on by application of a low voltage level (that is, smaller than VREFH) VCMDL to the conductive track $WL_i$ of the row containing the cell.

Further, all along the set or reset phase, to avoid an unwanted switching of a resistive storage element in another cell of the array, the conductive tracks $VBL_j$ of the other columns of the array may be maintained at a low-level voltage (smaller than VREFH) VINT1L, the conductive tracks $VAL_i$ of the other rows of the array may be maintained at a low-level voltage (smaller than VREFH) VINT2L, and the conductive tracks $WL_i$ of the other rows of the array may be maintained at reference voltage VREFH.

FIG. 5B shows relative voltages applied to an embodiment of a resistive memory. Level VINT1L may be selected to ensure that transistors 105 of the non-activated cells of the row comprising the programmed cell $300_{ij}$ are off, while limiting to an acceptable level the source-drain voltage seen by these transistors, for example, to a level lower than or equal to the nominal drain-source voltage specified for these transistors. In particular, level VINT1L is selected to be smaller than VCMDL+VTH, where VTH is the threshold voltage of transistors 105, so that the source-gate voltage of transistors 105 of the non-activated cells in the row is smaller than threshold voltage VTH of transistors 105. Level VINT1L is for example substantially equal to level VCMDL. As a variation, level VINT1L is in the range from VCMDL+VTH to VREFL.

Level VINT2L may be selected to limit to an acceptable level the drain-source voltage of transistors 105 of the other rows in the array, for example, to a level smaller than or equal to the nominal drain source voltage specified for these transistors. As an example, level VINT2L is greater than level VREFL. Level VINT2L is for example substantially equal to level VINT1L, for example, in the order of VCMDL.

Specific embodiments have been described. Various alterations, modifications, and improvements will occur to those skilled in the art. In particular, the described embodiments are not limited to the above-mentioned examples where the basic programmable resistive element of the memory is of PCM type. More generally, the described embodiments may be adapted to any type of programmable resistive element compatible with a unipolar operation, for example, programmable resistive elements of unipolar OxRAM type, as well as all the resistive elements where the polarity of the programming current does not matter, for example, the resistive elements where the programming is performed by Joule effect.

Further, the described embodiments are not limited to the above-described specific case where the electrodes of the basic programmable resistive element of the memory are differentiated (anode/cathode). The above-described embodiments are also compatible with symmetrical or "non-polar" programmable resistive elements.

Further, although only examples of control methods where a single elementary cell of the memory is programmed have been described hereabove, the above-described embodiments are compatible with an operation where a plurality of elementary cells of a same row or of a same column are simultaneously programmable. As an example, in the embodiment of FIG. 4A, to simultaneously program a plurality of cells of a same column, a plurality of high-voltage programming voltage pulses may be simultaneously applied to the conductive tracks $VAL_i$ controlling the rows comprising the cells to be programmed. To simultaneously program a plurality of cells of a same row, the row control conductive line $VAL_i$ may be maintained at a high reference voltage VREFH, for example, of level VH, for the entire programming phase, and low-level programming voltage pulses, that is, smaller than VREFH, may be simultaneously applied to the conductive tracks $VBL_j$ (initially at level VREFH or at level VINT1) controlling the columns comprising the cells to be programmed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory circuit comprising a plurality of elementary cells arranged in rows and in columns, each cell comprising:
   a programmable resistive element having a first end directly connected by a conductive track or wire to a first node of the cell; and
   a control transistor having a first conduction node directly connected by a conductive track or wire to a second end of the resistive element, a second conduction node directly connected by a conductive track or wire to a second node of the cell, and a control node connected to a third node of the cell,
   wherein, in each row, the cells in the row have their first nodes connected to a same first row control conductive track and have their third nodes connected to a same second row control conductive track, and, in each column, the cells have their second nodes connected to a same column control conductive track,
   the memory circuit further comprising a control circuit configured to implement operations of setting and resetting elementary cells of the memory according to a unipolar operating mode, the control circuit configured to, during a step of setting or resetting a cell:
   apply a first voltage to the conductive track controlling the column comprising the cell to be programmed;
   apply a second voltage to the first conductive track controlling the row comprising the cell to be programmed;
   apply a third voltage to the second conductive track controlling the row comprising the cell to be programmed, the third voltage configured to turn on the control transistor of the cell to be programmed;
   apply a fourth voltage to the conductive tracks controlling columns which do not comprise the cell to be programmed, the fourth voltage configured to turn off the control transistors in the cells comprised both in said columns and in the row comprising the cell to be programmed; and
   apply a fifth voltage to the first conductive tracks controlling rows which do not comprise the cell to be programmed, wherein the fifth voltage has a level intermediate between the first and second voltages.

2. The memory circuit of claim 1, wherein, in each cell, the control transistor is an N-channel MOS transistor.

3. The memory circuit of claim 2, wherein the second and third voltages are greater than the first voltage, and the fourth voltage is greater than the third voltage minus a threshold voltage of the control transistor.

4. The memory circuit of claim 2, wherein the fourth voltage is in the range from the third voltage minus a threshold voltage of the control transistor to the second voltage.

5. The memory circuit of claim 2, wherein the fourth voltage is smaller than the second voltage.

6. The memory circuit of claim 1, wherein, in each cell, the control transistor is a P-channel MOS transistor.

7. The memory circuit of claim 6, wherein the second and third voltages are smaller than the first voltage, and the fourth voltage is smaller than the third voltage plus a threshold voltage of the control transistor.

8. The memory circuit of claim 6, wherein the fourth voltage is in the range from the second voltage to the third voltage plus a threshold voltage of the control transistor.

9. The memory circuit of claim 6, wherein the fourth voltage is greater than the second voltage.

10. The memory circuit of claim 1, wherein the control circuit is configured to apply the fifth voltage to the first conductive tracks controlling rows which do not comprise the cell to be programmed during a phase of programming the cell, wherein a difference between the first and fifth voltages is, in absolute value, smaller than or equal to a nominal maximum voltage specified for the cell control transistors.

11. The memory circuit of claim 10, wherein the fourth and fifth voltages are substantially equal.

12. The memory circuit of claim 1, wherein the third, fourth, and fifth voltages are substantially equal.

13. The memory circuit of claim 1, wherein the fourth voltage has a level intermediate between the first and second voltages.

14. A memory circuit comprising a plurality of elementary cells arranged in rows and in columns, each cell comprising:
   a programmable resistive element having a first end directly connected by a conductive track or wire to a first node of the cell; and
   a control transistor having a first conduction node directly connected by a conductive track or wire to a second end of the resistive element, a second conduction node directly connected by a conductive track or wire to a second node of the cell, and a control node connected to a third node of the cell,
   wherein, in each row, the cells in the row have their first nodes connected to a same first row control conductive track and have their third nodes connected to a same second row control conductive track, and, in each column, the cells have their second nodes connected to a same column control conductive track,
   the memory circuit further comprising a control circuit configured to implement operations of setting and resetting elementary cells of the memory according to a unipolar operating mode, the control circuit configured to, during a step of setting or resetting a cell:
   apply a first voltage to the conductive track controlling the column comprising the cell to be programmed;

apply a second voltage to the first conductive track controlling the row comprising the cell to be programmed;

apply a third voltage to the second conductive track controlling the row comprising the cell to be programmed, the third voltage configured to turn on the control transistor of the cell to be programmed; and apply a fourth voltage to the conductive tracks controlling columns which do not comprise the cell to be programmed, the fourth voltage configured to turn off the control transistors in the cells comprised both in said columns and in the row comprising the cell to be programmed, wherein the fourth voltage has a level intermediate between the first and second voltages.

15. The memory circuit of claim 14, wherein, in each cell, the control transistor is an N-channel MOS transistor and wherein the first voltage is lower than the second voltage.

16. The memory circuit of claim 15, wherein the third voltage is greater than the first voltage, and the fourth voltage is greater than the third voltage minus a threshold voltage of the control transistor.

17. The memory circuit of claim 14, wherein, in each cell, the control transistor is a P-channel MOS transistor and wherein the first voltage is greater than the second voltage.

18. The memory circuit of claim 17, wherein the third voltage is smaller than the first voltage, and the fourth voltage is smaller than the third voltage plus a threshold voltage of the control transistor.

* * * * *

UNITED STATES PATENT AND TRADEMARK OFFICE
CERTIFICATE OF CORRECTION

PATENT NO. : 10,297,319 B2
APPLICATION NO. : 15/487303
DATED : May 21, 2019
INVENTOR(S) : Bastien Giraud et al.

It is certified that error appears in the above-identified patent and that said Letters Patent is hereby corrected as shown below:

On the Title Page

At item (54) "MEMORY DEVICE WITH UNIPOLAR RESISTIVE MEMORY CELLS WITH PROGRAMMABLE RESISTIVE ELEMENT END CONTROL TRANSISTOR AND SET/RESET OPERATIONS OF THEREOF" should read --MEMORY DEVICE WITH UNIPOLAR RESISTIVE MEMORY CELLS WITH PROGRAMMABLE RESISTIVE ELEMENT AND CONTROL TRANSISTOR AND SET/RESET OPERATIONS OF THEREOF--.

Signed and Sealed this
Twenty-third Day of July, 2019

Andrei Iancu
*Director of the United States Patent and Trademark Office*